United States Patent

Mahon et al.

[11] Patent Number: 6,014,320
[45] Date of Patent: Jan. 11, 2000

[54] HIGH DENSITY STACKED CIRCUIT MODULE

[75] Inventors: Shawn M. Mahon, Howard Lake; Theodore T. Paczkowski, Spring Park; Steven R. Schmieg, Victoria, all of Minn.

[73] Assignee: Hei, Inc., Victoria, Minn.

[21] Appl. No.: 09/050,318

[22] Filed: Mar. 30, 1998

[51] Int. Cl.[7] .................................. H05K 1/14; H01R 9/09
[52] U.S. Cl. .......................... 361/803; 361/749; 361/790
[58] Field of Search .......................... 174/117 FF, 254, 174/260, 268; 361/748, 749, 760, 774, 776, 778, 783, 782, 784, 789, 790, 803; 439/65, 67, 68, 69, 71, 74, 77, 83, 493, 591, 44

[56] References Cited

U.S. PATENT DOCUMENTS

| 4,342,883 | 8/1982 | Wernet et al. | 361/749 |
| 4,858,071 | 8/1989 | Manabe et al. | 361/749 |
| 4,997,377 | 3/1991 | Goto et al. | 439/67 |
| 5,168,430 | 12/1992 | Nitsch et al. | 361/749 |
| 5,789,815 | 8/1998 | Tessier et al. | 361/749 |
| 5,821,614 | 10/1998 | Hashimoto et al. | 361/749 |

FOREIGN PATENT DOCUMENTS

| 5-88194 | 4/1993 | Japan . |
| 5-335714 | 12/1993 | Japan . |
| 6-334098 | 12/1994 | Japan . |
| 6-338585 | 12/1994 | Japan . |
| 8-172176 | 7/1996 | Japan . |
| 8-307777 | 11/1996 | Japan . |

*Primary Examiner*—Donald Sparks
*Attorney, Agent, or Firm*—Schwegman, Lunderberg, Woessner & Kluth PA

[57] ABSTRACT

A high density circuit module construction uses a flex circuit attached to a substrate and folded over on it to provide higher packaging density while providing an increase in the surface area available for I/O pads. A substrate has components such as ICs mounted on one surface, and module I/O pads on the opposite surface. This surface also provides interconnects for the flex circuit. The flex circuit has one portion attached to the interconnect pads on one surface of the substrate. Another portion of the flex circuit folds around the substrate and is attached to the other side of the substrate. The surface area of this portion of the flex circuit provides in additional surface area for mounting circuit components, within essentially the same footprint area as the substrate. This module construction provides a higher density than prior art constructions, while providing a larger, unobstructed area for the I/O pads, which simplifies connecting the module into a larger assembly.

3 Claims, 4 Drawing Sheets

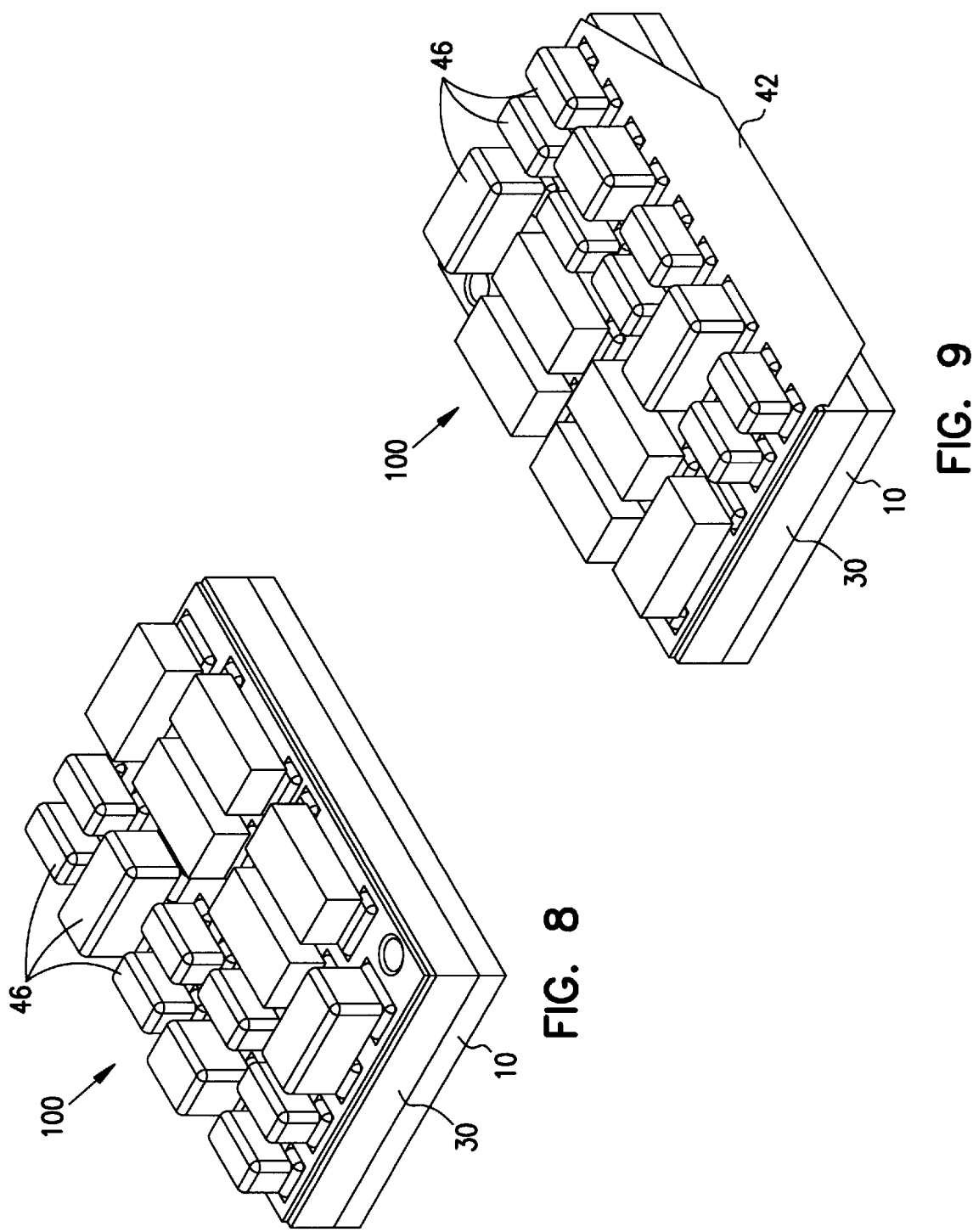

6,014,320

HIGH DENSITY STACKED CIRCUIT MODULE

FIELD OF THE INVENTION

This invention pertains generally to the field of circuit modules, and specifically to a stacked circuit module construction which provides high packaging density and easy access to interconnect pads.

BACKGROUND OF THE PRIOR ART

Various types of fabrication technologies have been developed in the prior art for addressing the problem of manufacturing small, high density electronic circuit modules for various applications. The progress which has been made in miniaturization of circuits on integrated circuits (ICs) has not alleviated the problems in providing small packaging of modules. In part, this is because application engineers have taken advantage of decreasing IC feature size to develop more complex functionality in their circuit designs, which in turn may require more external passive components. Also, increasing circuit complexity tends to require a larger number of attachment pads for input/output (I/O) connections for the module. This in turn creates a need for more surface area of the module, further complicating any attempts to reduce the size of the circuit module. The result of these developments is that there is a need for even higher packaging density.

SUMMARY OF THE INVENTION

To overcome these and other problems in the prior art, the present invention provides an improved high density circuit module construction.

According to one aspect of the invention, a flex circuit is used in connection with a substrate, in a folded, stacked configuration to provide advantages of higher packaging density while providing an increase in the surface area available for I/O pads.

According to the invention a substrate is provided, upon which electronic components may be mounted and interconnected according to the particular circuit function to be realized by the module. I/O pads may also be provided on the substrate for connection to external circuits. A flex circuit is provided, with one portion thereof attached to interconnect pads on one surface of the substrate. Another portion of the flex circuit folds around the substrate and is attached to the other side of the substrate. The surface area of this portion of the flex circuit provides additional surface area for circuit components or I/O connection pads.

According to a preferred embodiment of the invention, circuit components are mounted on a first side of the substrate, and I/O pads and flex circuit interconnect pads are on the other side of the substrate. The other portion of the flex circuit folds around the substrate and is stacked on top of the component side of the substrate. Additional circuit components are mounted on this portion of the flex circuit.

According to a presently preferred embodiment, ICs may be mounted on the surface of the substrate, and may be optionally potted in epoxy, and passive components may be mounted on the flex circuit.

The invention thus provides a higher density than prior art constructions, while providing a larger, unobstructed area for the I/O pads, which simplifies connecting the module into a larger assembly.

BRIEF DESCRIPTION OF THE DRAWING

FIG. 8 is a view in perspective of a stacked circuit module according to a preferred embodiment of the invention; and FIG. 9 is a view similar to FIG. 8 from a different angle to show the other edge of the module.

DETAILED DESCRIPTION OF THE PREFERRED EMBODIMENTS

The improved circuit module of the present invention may be applied to any application where a small circuit module configuration is needed. By way of example, the invention has been successfully applied to modules for hearing aids. Because of the very small physical constraints placed upon in-the-ear hearing aids, high density and small dimensions are essential. The stacked module of the present invention has resulted in a savings of approximately 40% in volume compared to a prior art module configuration.

Figure 1:
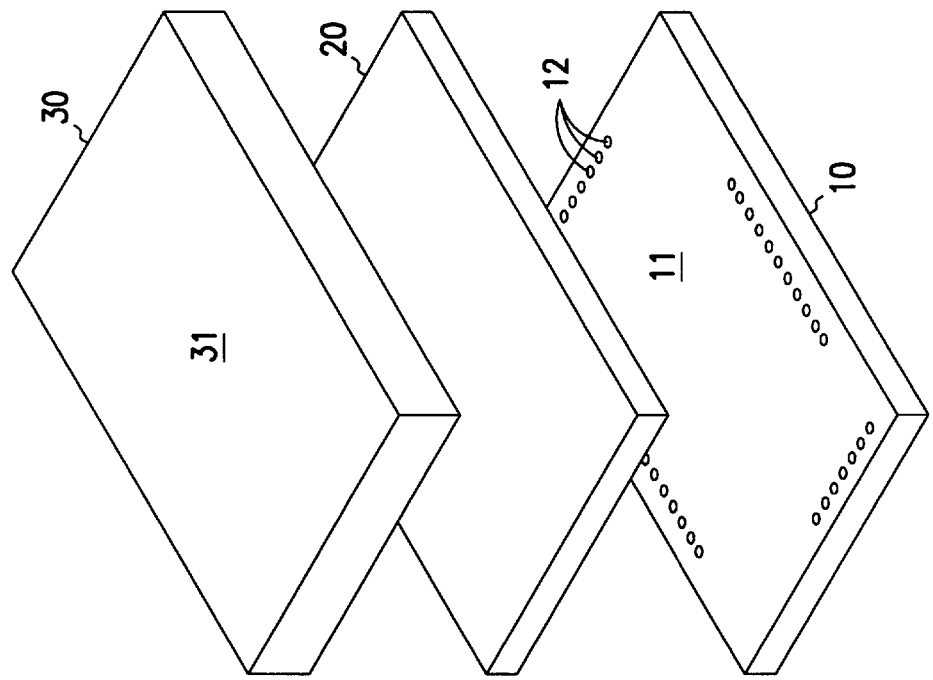
FIG. 1 is an exploded view in perspective of a substrate, IC and encapsulation layers which are a subassembly used in the formation of a circuit module according to a preferred embodiment of the invention.

The overall configuration of a circuit module according to a preferred embodiment of the invention is indicated by reference number 100 in FIGS. 8 and 9. Individual subassemblies and components making up module 100 are illustrated in the various other figures. In FIG. 1, reference number 10 is a substrate. This can be made of any suitable material, for example, ceramic material, although the invention is not limited to that particular material. For complex applications, substrate 10 may be a multi-layer substrate as is generally known in the art, containing appropriate signal traces and paths (not shown) as required for the particular electronic design being realized. A first surface indicated by reference number 11 has a plurality of IC interconnects, some of which are indicated by reference number 12. These are positioned to provide electrical and/or mechanical contact with signal pads on an integrated circuit 20, using one of various techniques as are generally known for securing an integrated circuit to a substrate while providing appropriate signal, power and ground connections thereto, such as wirebonding or flip chip mounting. In FIG. 1, a single large integrated circuit 20 is shown. It will be appreciated that a number of individual integrated circuits or components could be used in its place, for mounting on surface 11 of substrate 10, according to the needs of a particular circuit design.

After circuit 20 is placed on substrate 10 and secured thereto, it may optionally be encapsulated. The encapsulation step is not necessary in all applications, for example, if flip chip mounting is used. A preferred technique for applying encapsulation was developed by the assignee of the present invention, and involves forming small ceramic pieces and gluing them all the way around the edges of the substrate to form a dam for the epoxy potting material. Such ceramic pieces are formed with a length according to the side dimensions of the substrate and a height selected in accordance with the depth or thickness of the intended epoxy layer so as to contain the epoxy as it is poured onto the surface to cover the IC or ICs and other components. After curing, the epoxy forms the encapsulation layer indicated by reference number 30. In actual assembly, as shown in FIG. 2, the encapsulation layer 30 covers the surface 11 of substrate 10, and any and all integrated circuits or other components placed thereon previously.

Figure 2:
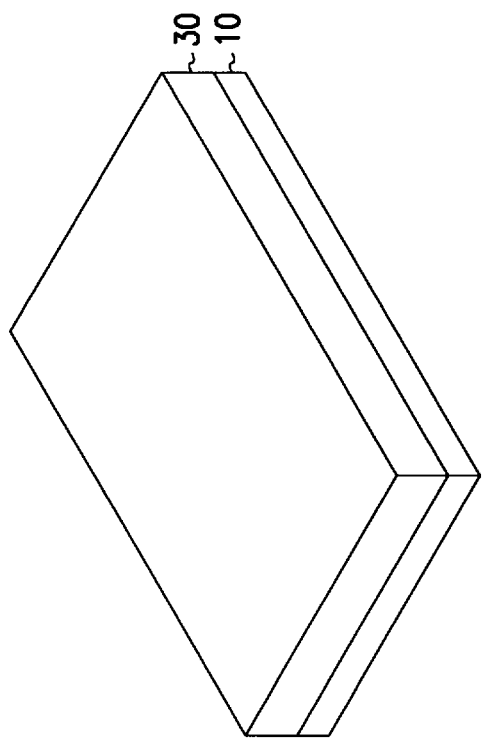
FIG. 2 is a view in perspective of the subassembly of FIG. 1.
Figure 3:
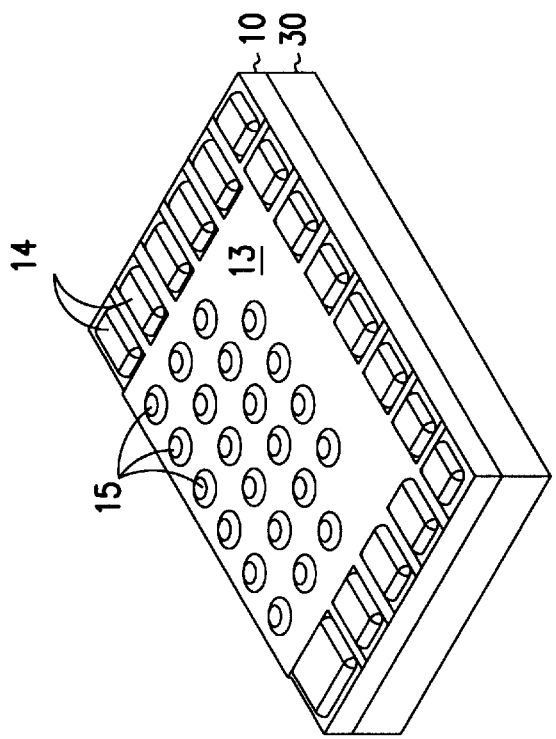
FIG. 3 is a view in perspective similar to FIG. 2 but inverted to show the other side.

FIG. 3 shows the subassembly of FIGS. 1–2 inverted, to show the other side of substrate 10. This surface is indicated by reference number 13, and is seen to include a number of I/O pads 14. These may be metallized layers, with solder bumps, suitable for attachment to leads for input/output and power purposes when the finished module is connected into the hearing aid, or other component or final assembly according to the particular design of the module. There may be any number of such I/O pads 14, arranged in any particular pattern as needed, but a preferred form places them generally around the outside edges of surface 13 as shown. If necessary, multiple rows can be used.

Figure 4:
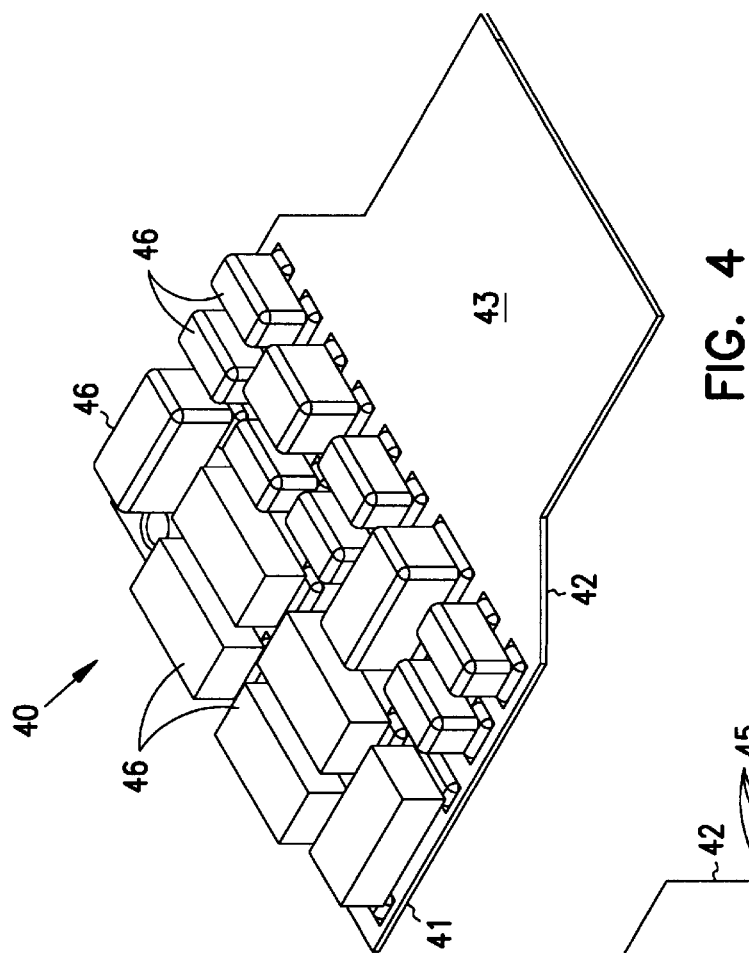
FIG. 4 is a view in perspective of a flex circuit and passive components which comprise another subassembly for a circuit module according to a preferred embodiment of the invention.
Figure 5:
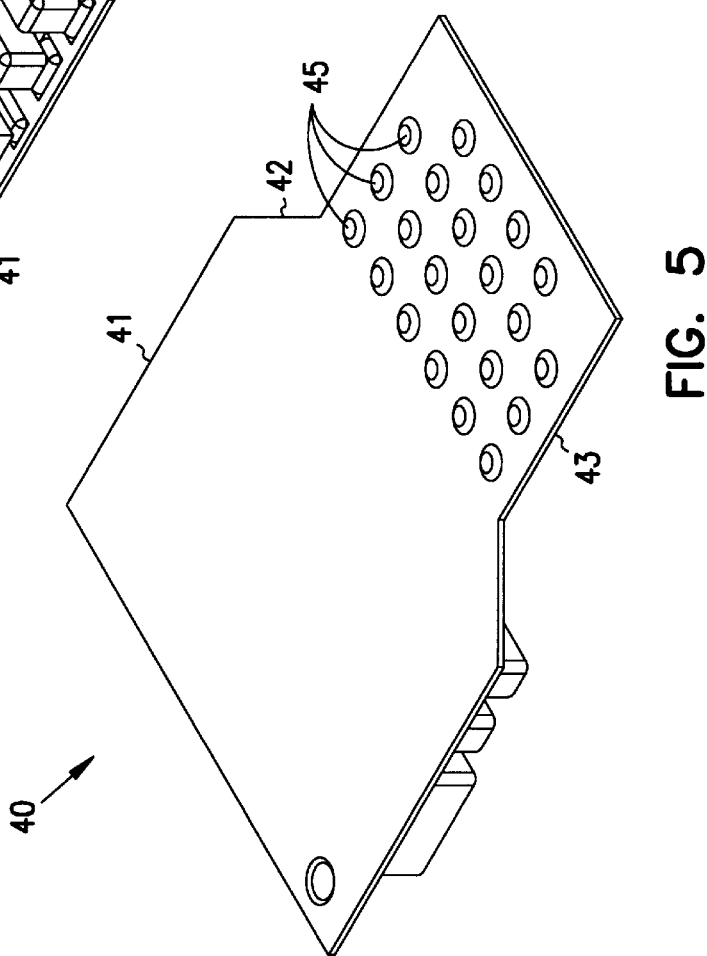
FIG. 5 is a view similar to FIG. 4 with the subassembly inverted to show the other side.

Surface 13 also has a plurality of pads indicated by reference number 15, which are used for attachment of the flex circuit 40 (FIGS. 4–5). These flex attach pads 15 may likewise be metallized pads with or without solder bumps, and are arranged in a pattern to correspond with similar flex attach pads 45 formed on the flex circuit. All of I/O pads 14 and flex attach pads 15 connect to appropriate signal traces within substrate 10. Although the flex attach pads 15 can be placed in a variety of locations, a preferred form of the invention places them generally centrally, along one edge, for convenience in attaching the flex circuit.

The flex circuit 40 is shown best in FIGS. 4 and 5. The flex circuit is made out of suitable material as is generally known in the art, and contains the appropriate signal traces (not shown) to connect from flex pads 45 to the components 46. In the preferred embodiment components 46 are passive components, although ICs could also be mounted there for particular applications. Components 46 might be, for example, capacitors, which are needed for the implementation of the circuit being realized, but which take up a considerable amount of volume and surface area. Flex circuit 40 has a rectangular portion 41, sized to correspond to the subassembly of FIGS. 1–3. Flex circuit 40 also has a rectangular portion 43 sized to contain the flex attach pads 45 and fit over the mating pads 15 on surface 13, while providing clearance for the rows of I/O pads 14. A transition portion 42 extends between rectangular portions 41 and 43 and is curved around the edge of the stacked module in final assembly as seen in FIG. 9. Preferably, the components 46 are placed on connection pads on traces on one side of rectangular portion 41, where the appropriate signal traces connect and receive them. The flex attach pads are on the opposite side of the flex circuit for correct orientation when folded in the final assembly.

Figure 6:
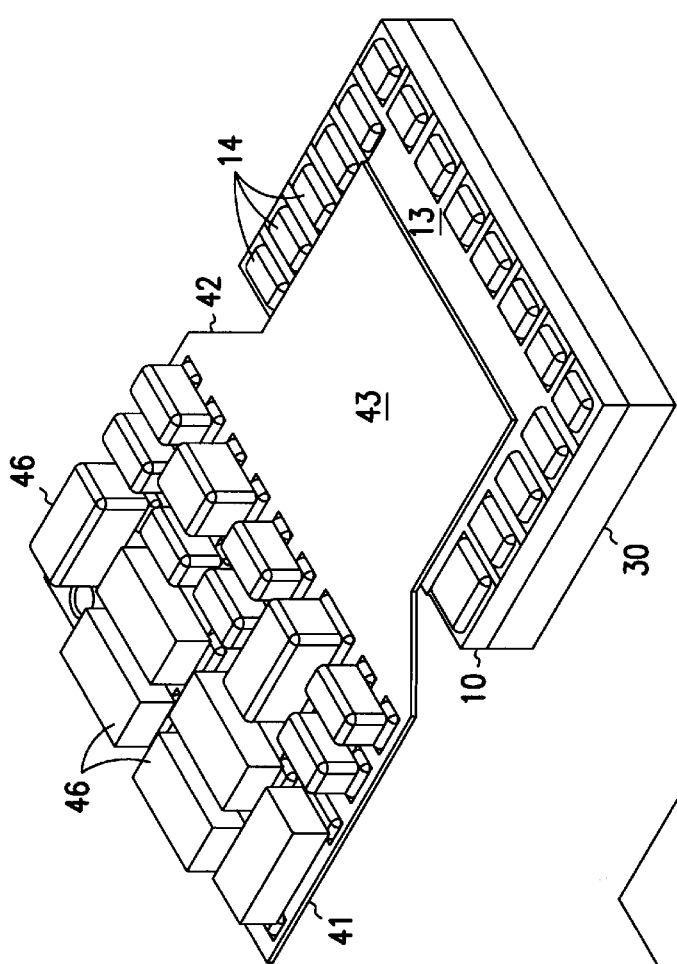
FIG. 6 is a view in perspective of a stage in the assembly of a flex circuit to the substrate.
Figure 7:
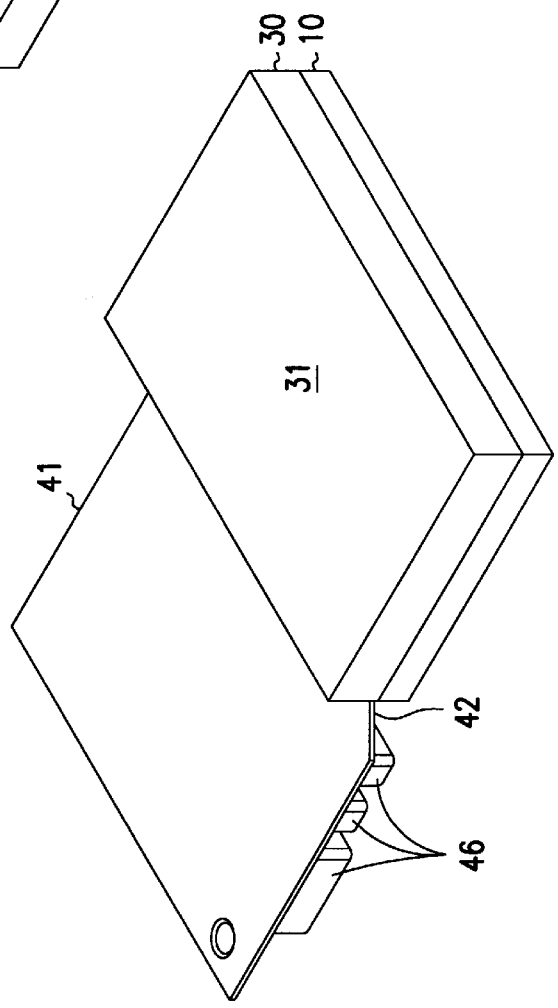
FIG. 7 is a view similar to FIG. 6 with the subassembly inverted to show the other side.

As seen in FIG. 6, the flex circuit subassembly containing the passive components mounted thereto is placed with its portion 43 abutting surface 13 of substrate 10, and with the corresponding flex attach pads 15 and 45 in contact with one another. These are soldered in place, and in addition, the flex circuit can be adhesively secured to surface 13. FIG. 6 also shows how the portion 42 provides a transition in width of the flex circuit to provided clearance so as not to obscure or prevent access to the row of I/O pads 14.

The flex circuit is then folded with the intermediate portion 42 curving around an edge of substrate 10 and encapsulation 30, and with the underside of the rectangular portion 41, that is, the side not having the components mounted thereto, in contact with the top surface 31 of encapsulation 30. It is preferably held in place there by adhesive or other means.

It will thus be seen that the flex circuit is used to provide a folded, stacked structure wherein the one set of components is placed over the same footprint or surface area as used by the components mounted on the substrate. In addition, the underside of the finished module may have no components to interfere with ready access to the I/O pad when it comes time to connect the circuit module in the final target device. A prior art circuit module which did not use a flex circuit or a stacked configuration, had passive components such as capacitors 46 and I/O port such as 14, all mounted on the same underside of substrate 10, where they contended for space with one another. Since these components have a certain height to them, it made it difficult for an assembly person later to connect the necessary lead wires to the I/O ports. Also, the necessity of providing both the I/O pads and the external circuit components on the same surface led to a larger size requirement for the module.

The present invention, by providing the folded, stacked structure, provides maximum footprint surface area as needed for the passive components, without interfering with the space needed for the I/O pads.

It will be appreciated that although the illustrated preferred embodiment uses ICs on one side of the substrate encapsulated, and passive components such as capacitors positioned on the flex circuit, it will be appreciated that either type of component can be used in either location as necessary or expedient for a given design.

It is to be understood that the above description is intended to be illustrative, and not restrictive. Niany other embodiments will be apparent to those of skill in the art upon reviewing the above description. The scope of the invention should, therefore, be determined with reference to the appended claims, along with the full scope of equivalents to which such claims are entitled.

We claim:

1. A high density circuit module, comprising:
   a substrate;
   at least one electrical component positioned and connected on a surface of the substrate;
   I/O pads positioned on another surface thereof;
   a flex circuit, and mating interconnects on the flex circuit and substrate providing electrical connection therebetween;
   at least one component positioned and connected on the flex circuit;
   the flex circuit folded over and positioned adjacent a surface of the substrate, to form a high density module.

2. A high density circuit module, comprising:
   a substrate having at least one electrical component mounted on a first side thereof, and having interconnect pads and module I/O pads on a second side thereof;
   a flex circuit having interconnect pads a first portion for mating with the substrate, and having at least one electrical component mounted on a second portion thereof, and a foldable portion in between;
   the flex circuit attached to the substrate with the interconnect pads of its first portion electrically connected to the interconnect pads of the substrate, the foldable portion folding around an edge of the substrate, and the second portion of the flex circuit attached to the first side of the substrate.

3. A module according to claim 2 further including encapsulating material over the component on the first side of the substrate, with the second portion of the flex circuit attached to the encapsulating material of the substrate.

* * * * *

UNITED STATES PATENT AND TRADEMARK OFFICE
CERTIFICATE OF CORRECTION

PATENT NO. : 6,014,320

DATED: Jan. 11, 2000

INVENTOR(S) : Shawn M. Mahon

It is certified that error appears in the above-identified patent and that said Letters Patent is hereby corrected as shown below:

On the title page:
    Item [73], Assignee, delete "Hei" and therefor insert --HEI--.

On the title page,
    where the Attorney, Agent, or Firm is specified, delete "Lunderberg" and therefor insert --Lundberg--.

On the title page, in the abstract, line 12, delete "in additional" and therefore insert --an additional--.

Signed and Sealed this

Twenty-sixth Day of December, 2000

Q. TODD DICKINSON

*Attest:*

*Attesting Officer*                *Director of Patents and Trademarks*